(12) United States Patent
Andoh

(10) Patent No.: US 6,538,478 B2
(45) Date of Patent: Mar. 25, 2003

(54) NOISE IMMUNE PEAK DETECTOR

(75) Inventor: Hajime Andoh, Shiga (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/992,422

(22) Filed: Jan. 21, 2001

(65) Prior Publication Data

US 2002/0079932 A1 Jun. 27, 2002

Related U.S. Application Data

(60) Provisional application No. 60/253,372, filed on Nov. 28, 2000.

(51) Int. Cl.$^7$ ................................................ G01R 19/00
(52) U.S. Cl. ........................................... 327/59; 327/60
(58) Field of Search .............................. 327/58, 59, 60, 327/62

(56) References Cited

U.S. PATENT DOCUMENTS

| | | | | | |
|---|---|---|---|---|---|
| 3,939,365 | A | * | 2/1976 | Lindgren | 327/58 |
| 4,603,299 | A | * | 7/1986 | Monett | 327/58 |
| 4,992,674 | A | * | 2/1991 | Smith | 327/59 |
| 5,428,307 | A | * | 6/1995 | Dendinger | 327/60 |

\* cited by examiner

*Primary Examiner*—Toan Tran
(74) *Attorney, Agent, or Firm*—W. Daniel Swayze, Jr.; W. James Brady; Frederick J. Telecky, Jr.

(57) ABSTRACT

A peak detector circuit for detecting a peak output signal including an input circuit for inputting an input signal, a comparator for comparing the input signal and said peak output signal to generate a difference signal, a current source to generate a current in response to the difference signal, and a comparator to generate the peak output signal based on said current.

3 Claims, 1 Drawing Sheet

NOISE IMMUNE PEAK DETECTOR

This application claims priority under 35 USC §119(e)(1) of provisional application Ser. No. 60/253,372, filed Nov. 28, 2000.

FIELD OF THE INVENTION

The present invention relates to a peak detector and more specifically to a peak detector design for low amplitude wide band AC signals.

BACKGROUND OF THE INVENTION

An AC peak detector is a non-linear circuit used to obtain a steady state amplitude at the level of the peak amplitude of the input AC signal. The input AC signal may not be a uniform sinusoid, an infinite sum of sinusoids as in a square wave signal, but any signal with approximately complimentary positive and negative voltage peaks, $+V_{PK}$ and $-V_{PK}$ such as a data communication signal or a signal used from an HDD or a DVD system. A number of different peak detector designs are known. However, each design has shortcomings within which limit the range of operability and performance within that range. In particular there is a need for peak detectors which detect peaks with amplitude as low as 50 or even 20 millivolts.

In disks such as DVD or DVD-RAM, information is recorded in sector units. Each sector unit is comprised of a header information area having physical information data (PID) area and user data area. The header information area is divided into a peak header area and a bottom header area, and the user data area is divided into a land area and a groove area.

Fingerprints, dust and scratches on the disk result in noise being generated in the DVD recording playback system. Consequently, there is a need for limiting the effects of this noise in both magnitude and duration of the noise. In FIG. 1, a comparator 100 accepts an input signal, and this input signal is compared with the output signal. The output of the comparator 100 produces a pulse whenever the input signal exceeds the output signal or whenever a new peak occurs. The output of comparator 100 is connected to current source 102 to control the output of current source 102, and capacitor 104. The comparator 100 controls the current generator current source in such a manner to produce more current when the pulses are generated from capacitor 100 or more particularly when the input voltage exceeds the output voltage. The current flows from current source 102 to capacitor 104 where the current charges the capacitor 104 to a point where the output voltage is equal to the input voltage at which time the comparator 100 ceases output.

The output pulses and consequently the current generator 102 remain at a constant level and the voltage remains at the new peak. FIG. 2 illustrates the effect of a large noise signal to the circuit of FIG. 1. The output voltage follows the magnitude of the noise signal and the duration before the output voltage again begins to follow the peaks is significantly long. The length of time is due to the fact that it takes a significant amount of time before decay sets in as a result of capacitor 104 and the constant current source 106.

SUMMARY OF THE INVENTION

The present invention provides a peak detector which suppresses noise both in amplitude and duration. The present invention substantially reduces the duration that the effects of noise has on the output voltage. The present invention uses a bias voltage to operate a transistor so that a constant current places a charge on a capacitor to prevent the undesirable effects of a large input voltage in the form of noise.

DETAILED DESCRIPTION OF THE PRESENT INVENTION

Figure 1:
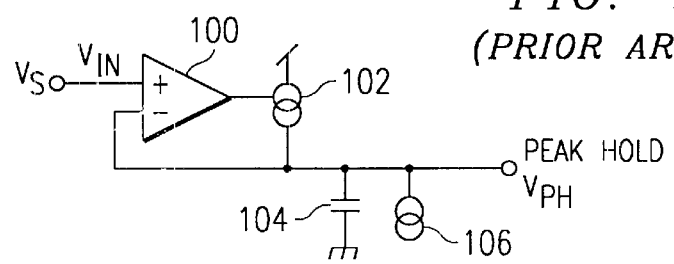
FIG. 1 illustrates a peak detector circuit.
Figure 2:
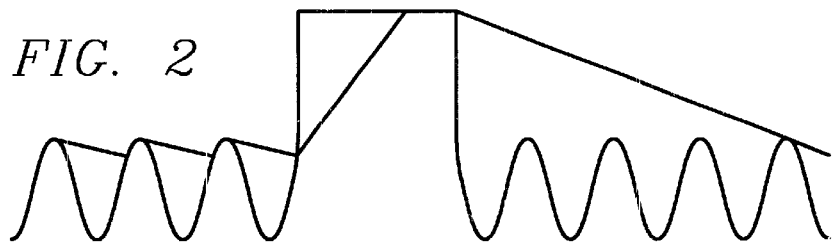
FIG. 2 illustrates the corresponding waveform of this peak detector circuit.
Figure 3:
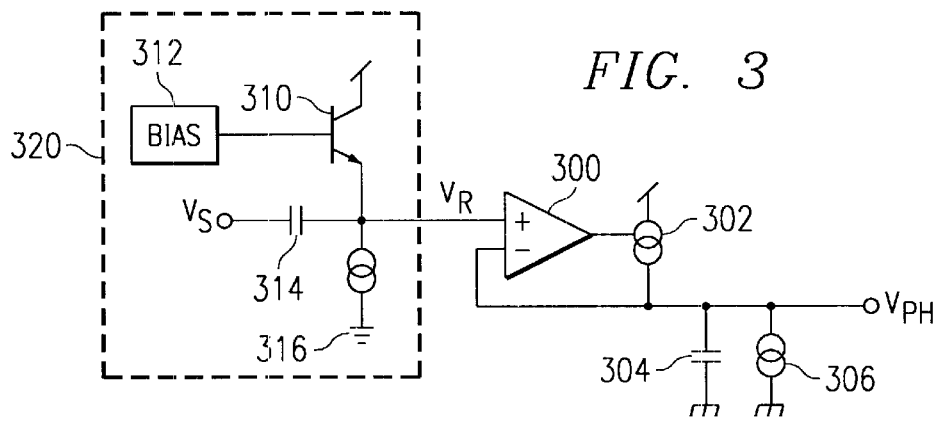
FIG. 3 illustrates a peak detector circuit of the present invention.
Figure 4:
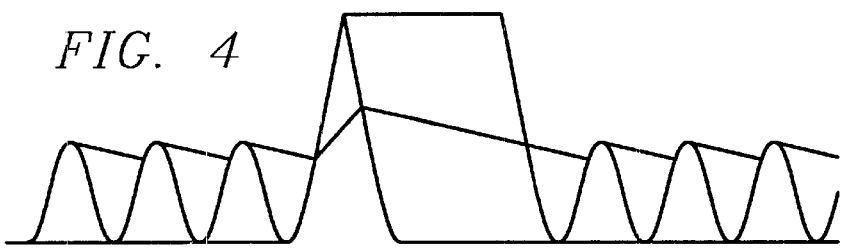
FIG. 4 illustrates the corresponding waveform of the peak detector of the present invention.

As illustrated in FIG. 3, a comparator 300 is connected to input circuit 320 and to receive the input voltage through capacitor 314 and to receive as additional input the output voltage. While the input voltage and output voltage can represent many types of voltages, for sake of discussion, the input voltage is referred to new peak while the output voltage is the old or present peak voltage. Current generator 316 generates a control current. The comparator 300 compares the input voltage and output voltage and produces a series of pulses when the input voltage exceeds the output voltage. The comparator 300 is connected to current source 302. The current source 302 is connected between $V_{CC}$ and capacitor 304. Additionally, the current source 302 is controlled and receives an input from comparator 300. The current source 302 is activated by the output signal, namely the series of pulses from comparator 300 to produce a current to charge up capacitor 304. The capacitor 304 is connected to the negative input of comparator 300, the current source 304, current source 306 and the output voltage.

Additionally, the comparator 300 is connected to the emitter of transistor 310, and the base of transistor 310 is connected to a bias voltage generator 312. Additionally, the collector is connected to voltage $V_{CC}$. The emitter of transistor 310 is connected to capacitor 314 and to current source 316 through terminal 320. Additionally, the capacitor 314 is connected to receive the input voltage.

In operation, the bias voltage 312 forces the transistor 310 to operate at a path current from collector to emitter. Any excess current (path current-constant current) from current source 316 flows to capacitor 314 and generates a capacitor voltage on the capacitor 304. The input voltage is received by capacitor 314. The capacitor 314 tends to eliminate sharp AC voltages and consequently tends to limit the noise. The input signal is input to comparator 300 which is compared with the output voltage to operate the current source 302. The current source 302 when operating under the control of capacitor 300 generates a current and places a charge on capacitor 304 which raises the output voltage. As the current is shut off from current source 302 when the input voltage is equal to the output voltage, the capacitor 304 discharges the voltage of the current through the current source 306 and the output voltage drops. However, because of the capacitor 314 and the voltage of node 320, the sharp noise is absorbed by capacitor 314 and consequently, the voltage at terminal 320 is less, reducing the input voltage to comparator 300.

What is claimed is:

1. A peak detector circuit for detecting a peak output signal comprising:
   an input circuit for inputting an input signal, said input circuit including a bias circuit, a comparator for comparing said input signal and said peak output signal to generate a difference signal, a current source to generate a current in response to said difference signal, and a first capacitor to generate said peak output signal being based on said current, wherein said bias circuit includes a transistor.

2. A peak detector circuit for detecting a peak output signal as in claim 1 wherein said input circuit includes a second capacitor.

3. A peak detector circuit for detecting a peak output signal as in claim 1 wherein said bias circuit includes said transistor being biased by a constant voltage.

* * * * *

UNITED STATES PATENT AND TRADEMARK OFFICE
CERTIFICATE OF CORRECTION

PATENT NO.    : 6,538,478 B2
DATED         : March 25, 2003
INVENTOR(S)   : Hajime Andoh It is certified that error appears in the above-identified patent and that said Letters Patent is hereby corrected as shown below:

<u>Title page,</u>
Item [22], Filed:, please delete "Jan. 21, 2001" and insert -- Nov. 21, 2001 --

Signed and Sealed this

Sixteenth Day of September, 2003

JAMES E. ROGAN
*Director of the United States Patent and Trademark Office*